(12) United States Patent  (10) Patent No.: US 7,763,916 B2
Morita  (45) Date of Patent: Jul. 27, 2010

(54) SUBSTRATE TABLE

(75) Inventor: Hiromi Morita, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/081,534

(22) Filed: Apr. 17, 2008

(65) Prior Publication Data

US 2008/0293187 A1    Nov. 27, 2008

(30) Foreign Application Priority Data

May 24, 2007   (JP) .............................. 2007-138142

(51) Int. Cl.
*H01L 29/76* (2006.01)
*H01L 31/062* (2006.01)
*H01L 31/113* (2006.01)
*H01L 31/119* (2006.01)
*H01L 31/94* (2006.01)

(52) U.S. Cl. ....................... 257/288; 257/127; 257/623; 257/E21.475; 257/E21.498; 257/E21.499; 257/E21.517; 257/E21.238

(58) Field of Classification Search ................ 257/127, 257/170, 290, 288, 428, 620, 623, 622, E21.238, 257/475, 517, 498, 499

See application file for complete search history.

(56) References Cited

U.S. PATENT DOCUMENTS

| 4,636,276 A * | 1/1987 | Nozaka .................. 156/353 |
| 6,767,426 B1 * | 7/2004 | Yamamoto ............... 156/270 |
| 7,078,262 B2 * | 7/2006 | Yamamoto et al. ......... 438/106 |
| 2007/0227655 A1 * | 10/2007 | Kajiyama et al. ...... 156/345.11 |

FOREIGN PATENT DOCUMENTS

| JP | 2004-119573 | 4/2004 |
| JP | 2004-235386 | 8/2004 |
| JP | 2004-296817 | 10/2004 |

\* cited by examiner

*Primary Examiner*—David Nhu
(74) *Attorney, Agent, or Firm*—Rabin & Berdo, PC

(57) ABSTRACT

A substrate table used for manufacturing a chip is provided. The substrate table includes a substrate stage, a substrate placement surface formed on the substrate stage, and on which a substrate is placed, and a guiding member that can project and retract from the substrate placement surface. The guiding member positions the substrate when the guiding member is at a projected position abutting an edge portion of the substrate placed on the substrate placement surface, and the guiding member retracts at a time of applying a tape to the substrate.

5 Claims, 17 Drawing Sheets

SUBSTRATE TABLE

CROSS-REFERENCE TO RELATED APPLICATION

This application claims priority under 35 USC 119 from Japanese Patent Application No. 2007-138142, the disclosure of which is incorporated by reference herein.

BACKGROUND OF THE INVENTION

1. Field of the Invention

The present invention relates to a substrate table used in an applying process in which a tape is applied to a substrate, and to a chip manufacturing method that manufactures chips by using the substrate table.

2. Description of the Related Art

In recent years, substrates have become thinner due to demands for compactness, lighter weight, and the like. Further, there are cases in which substrates are coated in order to increase the added value. Due to these processes, the substrate may warp.

There is proposed a substrate table having positioning pins which, even if a substrate warps, position the substrate that is placed on the substrate stage, and further, suppress the warping of the substrate (see, for example, Japanese Patent Application Laid-Open (JP-A) No. 2004-235386).

In more detail, the positioning pins that project from the substrate stage of the substrate table are formed in conical shapes in which the substrate stage sides of the pins are narrowed. By pushing the positioning pins toward the placed substrate from the periphery of the substrate, the edge portions of the substrate are pushed against the substrate stage along the conical surfaces of the positioning pins. In this way, the warping of the substrate is corrected, and the position of the substrate is determined.

By correcting the warping and determining the position of the substrate in this way, problems due to poor positioning of the substrate are prevented.

However, when an attempt is made to apply dicing tape or protective tape or the like to one surface of the substrate by using this substrate table, the conical positioning pins are a hindrance, and the tape cannot be applied.

SUMMARY OF THE INVENTION

In view of the aforementioned, the present invention provides a substrate table and a chip manufacturing method by which, even if a substrate is warped, the substrate can be positioned, tape can be applied to one surface of the substrate, the substrate can be cut accurately, and chips can be manufactured from the substrate without waste.

A first aspect of the present invention is a substrate table including: a substrate stage; a substrate placement surface formed on the substrate stage, and on which a substrate is placed; and a guiding member able to project and retract from the substrate placement surface, such that the guiding member positions the substrate due to the guiding member at a projected position abutting an edge portion of the substrate placed on the substrate placement surface and the guiding member retracts when applying a tape to the substrate.

A second aspect of the present invention is chip manufacturing method for manufacturing chips by positioning a ring-shaped substrate ring and a substrate, applying a dicing tape, and cutting the substrate in a dicing process, the method including: applying the dicing tape to the substrate ring; placing the substrate on the substrate placement surface of the substrate table of the first aspect; positioning the substrate ring with respect to the substrate; applying the dicing tape, that is applied to the substrate ring, to the substrate while retracting the guiding member; and cutting out chips by cutting the substrate with a dicing device, with the substrate ring as a reference.

A third aspect of the present invention is chip manufacturing method for manufacturing chips by positioning a ring-shaped substrate ring and a substrate, applying a dicing tape, and cutting the substrate in a dicing process, the method including: placing the substrate on the substrate placement surface of the substrate table of the first aspect; positioning the substrate ring with respect to the substrate; applying the dicing tape to the substrate and the substrate ring while retracting the guiding member; and cutting out chips by cutting the substrate with a dicing device, with the substrate ring as a reference.

BRIEF DESCRIPTION OF THE DRAWINGS

Exemplary embodiments of the present invention will be described in detail based on the following figures, wherein.

DETAILED DESCRIPTION OF THE INVENTION

A substrate table 10 relating to a present exemplary embodiment will be described in accordance with FIG. 1A through FIG. 13.

Figure 2:
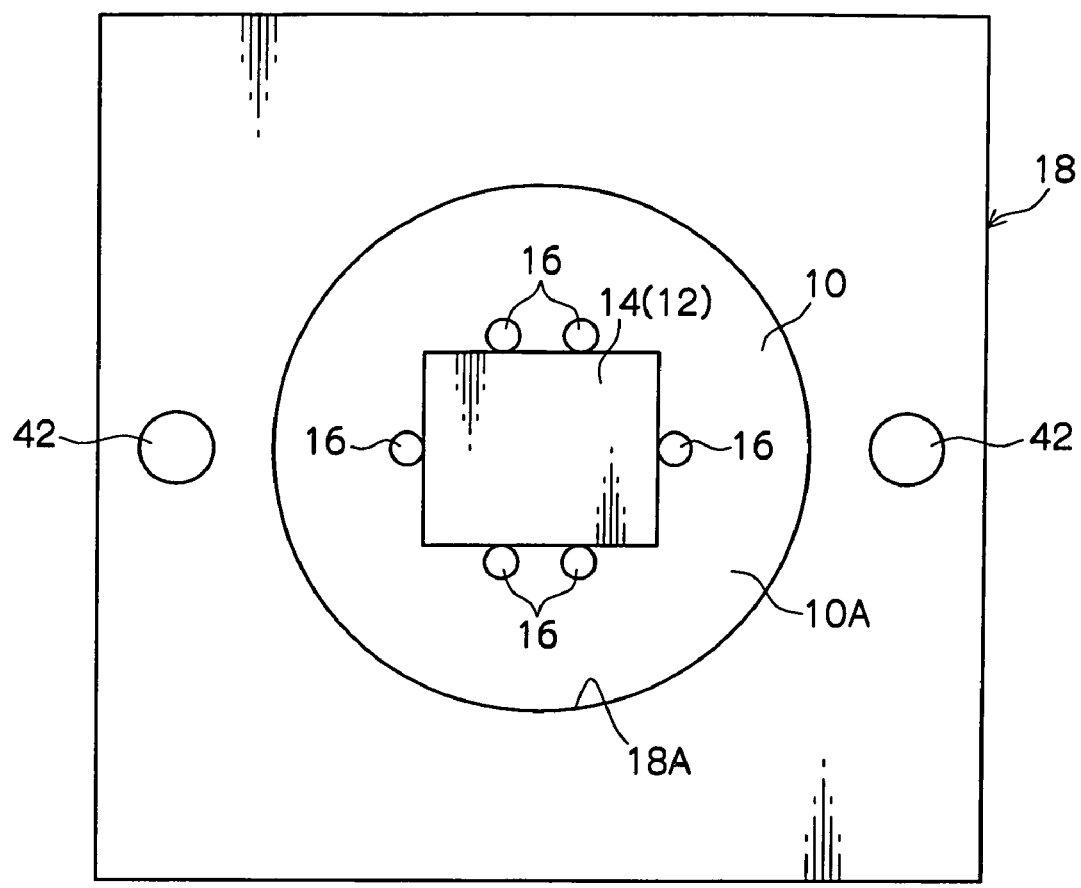
FIG. 2 is a plan view showing the substrate table, the stage unit and the like relating to the first exemplary embodiment.

As shown in FIG. 2, a glass plate 12, which serves as a substrate and is placed on the substrate table 10 of the exemplary embodiment, is formed in a rectangular shape.

The glass plate 12 is cut by a dicing device 46 (see FIG. 13) which will be described later, and becomes chips which can serve as IR (infrared) cut filters 22 (see FIG. 13) for cameras for cell phones. The glass plate 12 is formed in a thin plate shape (e.g., 0.2 mm to 2 mm) due to the demands for compactness, lighter weight, and the like in recent years. Further, in order to increase the added value, an infrared ray transmission preventing coating, which prevents the transmission of infrared rays, is coated on one surface of the glass plate 12.

Figure 1A:
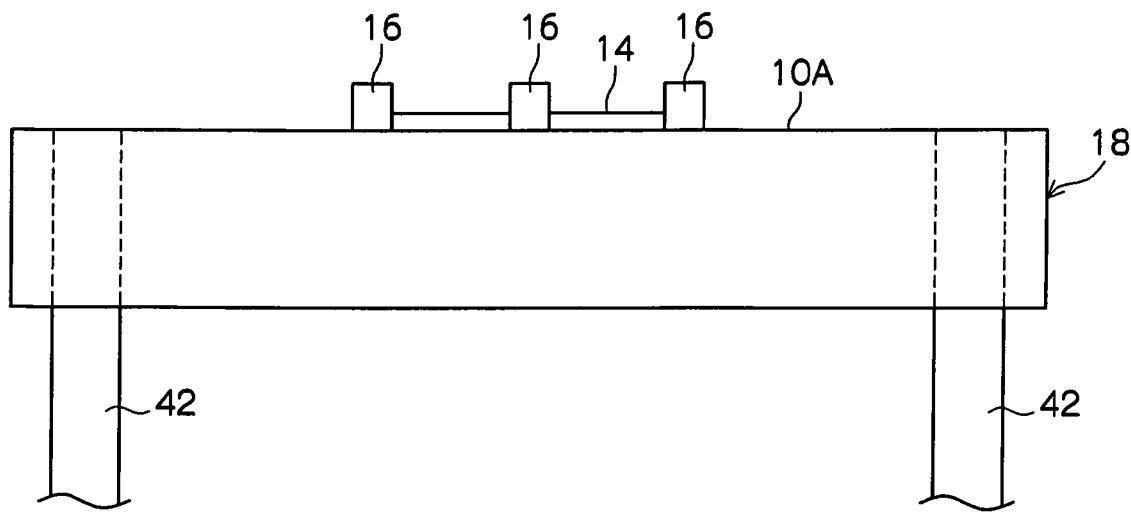
FIG. 1A is a side view showing a substrate table, a stage unit and the like relating to a first exemplary embodiment of the present invention.
Figure 1B:
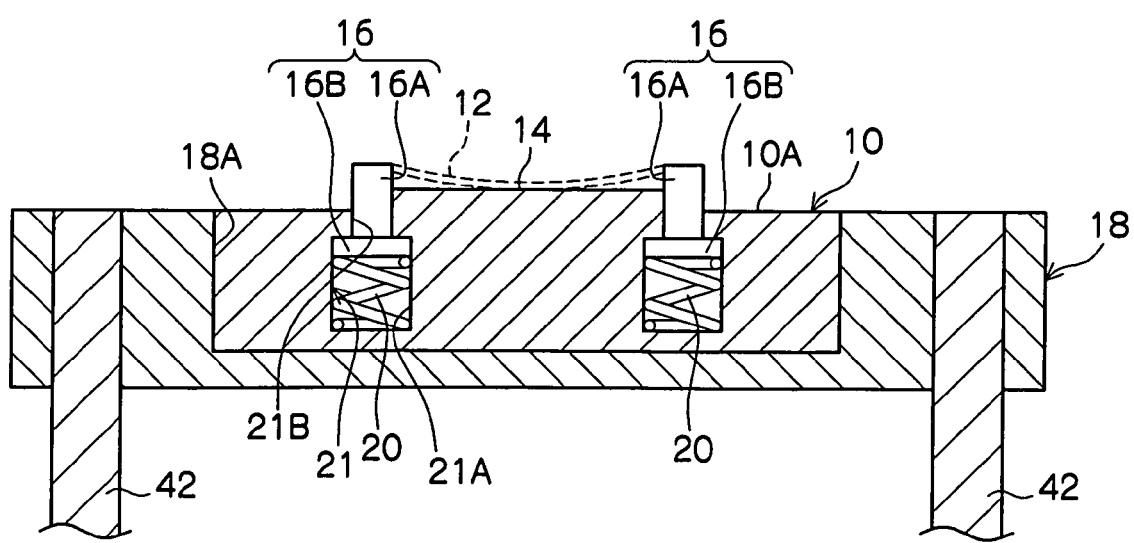
FIG. 1B is a cross-sectional view showing the substrate table, the stage unit and the like relating to the first exemplary embodiment.

As shown in FIG. 1A, FIG. 1B and FIG. 2, the substrate table 10 has a round shape as seen from above, and is fit-into a recess 18A which is formed concavely in a circular shape at the central portion of a rectangular stage unit 18. Further, a substrate placement surface 14, which is the same shape as the glass plate 12 placed thereon, is provided at the central portion of the substrate table 10 so as to project-out from the surface of a substrate stage 10A.

Guide pins 16, which are structured so as to be able to project and retract from the substrate placement surface 14, project-out from the substrate table 10 so as to surround the substrate placement surface 14. The guide pins 16 abut the edge sides of the glass plate 12 placed on the substrate placement surface 14, and determine the position of the glass plate 12.

In more detail, two (the number of first guide pins) guide pins 16 are disposed at each of one pair (first pair) of opposing sides of the glass plate 12, and one (the number of second guide pins) guide pin 16 is disposed at each of the other one pair (second pair) of opposing sides.

Further, the pair of sides of the glass plate 12 which are orthogonal with respect to the moving direction in which the stage unit 18, which the substrate table 10 is fit-in, moves to beneath a ring stage 38 which will be described later, are positioned by the two (the number of the first guide pins) guide pins 16. Namely, when the substrate table 10 moves, there is the concern that the glass plate 12 that is placed on the substrate table 10 will rotate. However, by being positioned by two guide pins, rotation of the glass plate 12 is restricted. Due to the other one pair of opposing sides being positioned by the one guide pin each, parallel movement of the glass plate 12 is restricted.

Further, as shown in FIG. 1B, receiving holes 21 are formed in the substrate table 10. The receiving holes 21 are formed by large diameter holes 21A and small diameter holes 21B being continuous. Stoppers 16B, which are provided at the bottom end portions of the guide pins 16, move within the large diameter holes 21A, and pin portions 16A project-out to the exterior from the small diameter holes 21B.

Coil springs 20 serving as urging members are provided in the large diameter holes 21A. The coil springs 20 urge the stoppers 16B upward, and urge the pin portions 16A to projected positions at which they project-out from the substrate placement surface 14.

Here, as described above, the glass plate 12 is formed in a thin plate shape, and further, in order to increase the added value, an infrared ray transmission preventing coating which prevents transmission of infrared rays is coated on one surface of the glass plate 12. Due thereto, there are cases in which the glass plate 12 warps as shown by the dotted line in FIG. 1B. The projected positions of the distal end portions of the guide pins 16 from the substrate placement surface 14, i.e., the lengths of the pin portions 16A, are determined in advance in consideration of the amount of this warping.

By adjusting the projected positions of the guide pins 16 in accordance with the amount of warping of the glass plate 12 in this way, even if there is a warped glass plate 12, the outer peripheral surfaces of the guide pins 16 abut the edge portions of the glass plate 12 and can position the glass plate 12.

Moreover, when applying a dicing tape 28 to one surface of the glass plate 12, the dicing tape 28 can be applied to the glass plate 12 while the guide pins 16 are pushed-in, against the urging forces of the coil springs 20, to the substrate placement surface 14 until the pin portions 16A of the guide pins 16 are at the same height as the glass plate 12. Accordingly, the guide pins 16 do not impede the work. Namely, even if the glass plate 12 is warped, the glass plate 12 can be positioned, and tape can be applied to one surface of the glass plate 12.

A tape applying device 30, that relates to the first exemplary embodiment and uses the substrate table 10 relating to the exemplary embodiment, will be described next.

Figure 3:
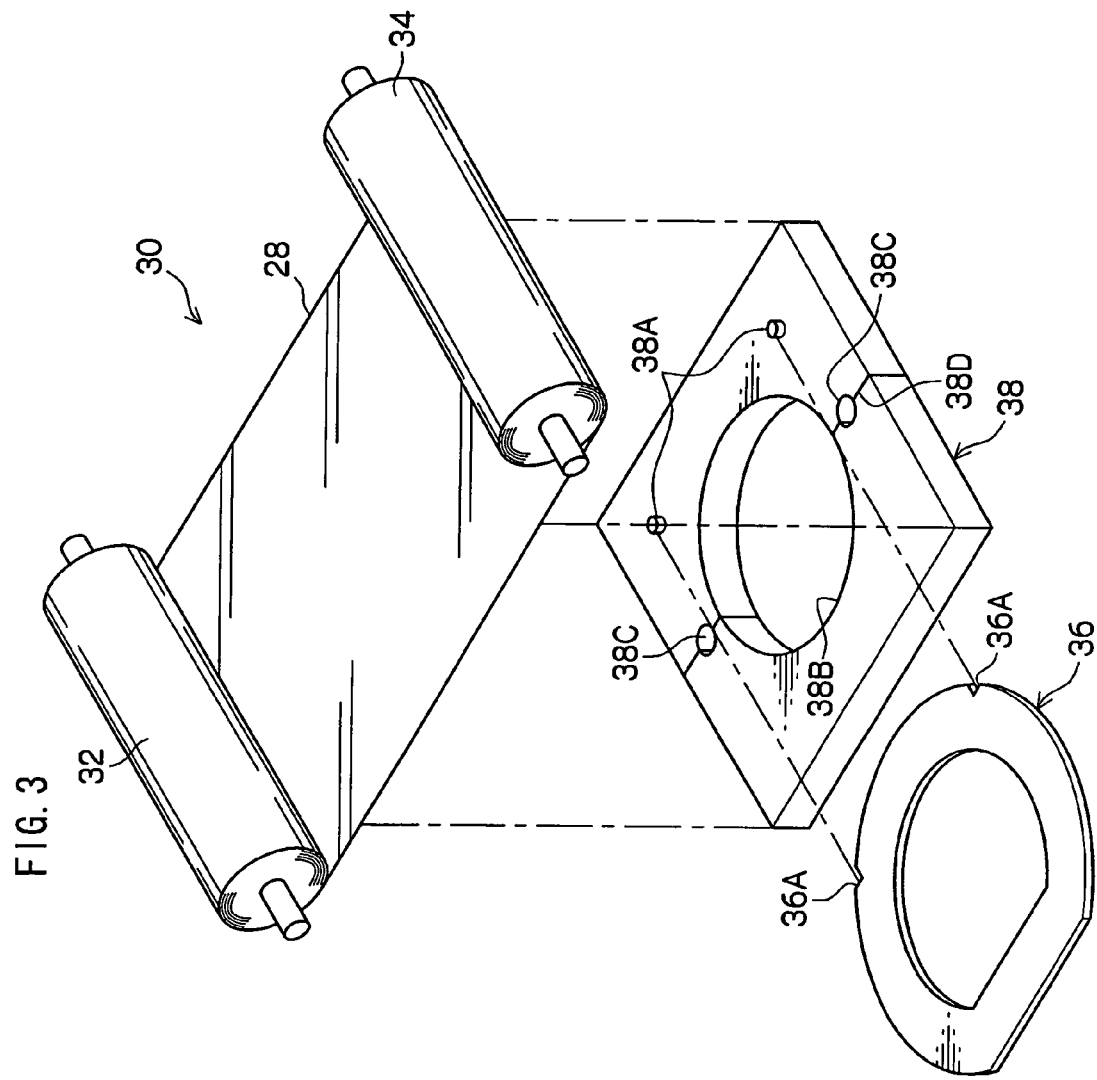
FIG. 3 is a perspective view showing a manufacturing method of manufacturing IR cut filters using the substrate table relating to the first exemplary embodiment.

As shown in FIG. 3, the tape applying device 30 includes a tape roller 32 around which the dicing tape 28 is wound, and a take-up tape roller 34 which takes-up the tape. Further, the under surface of the dicing tape 28 which extends between the tape roller 32 and the take-up tape roller 34 is structured to be an adhesion surface.

Figure 5:
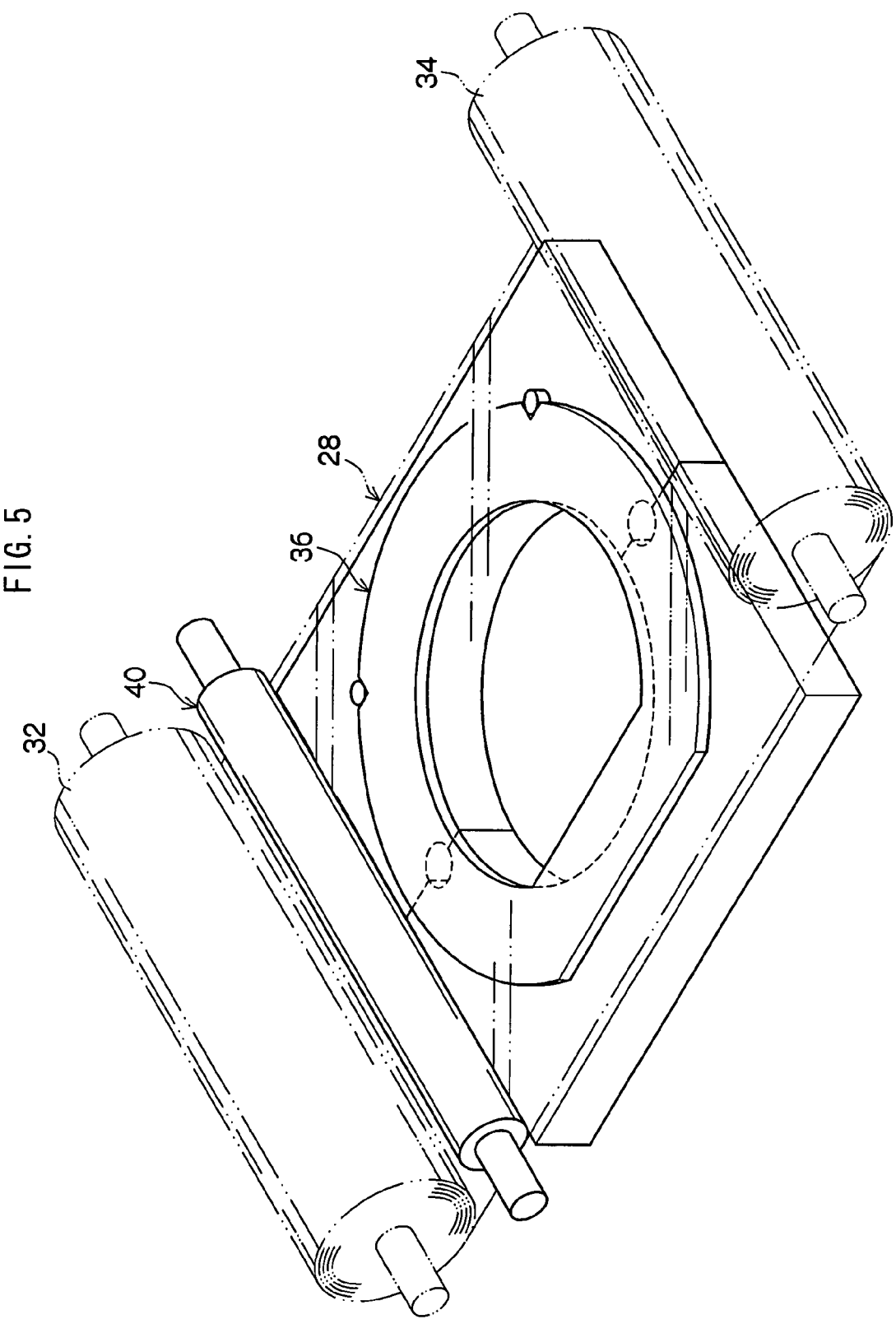
FIG. 5 is a perspective view showing the manufacturing method of manufacturing IR cut filters using the substrate table relating to the first exemplary embodiment.

Further, as shown in FIG. 5, a pressure-bonding roller 40 is disposed at the top surface of the dicing tape 28 which extends between the tape roller 32 and the take-up tape roller 34. The pressure-bonding roller 40 moves reciprocally between the tape roller 32 and the take-up tape roller 34 while pressing the dicing tape 28.

Figure 6:
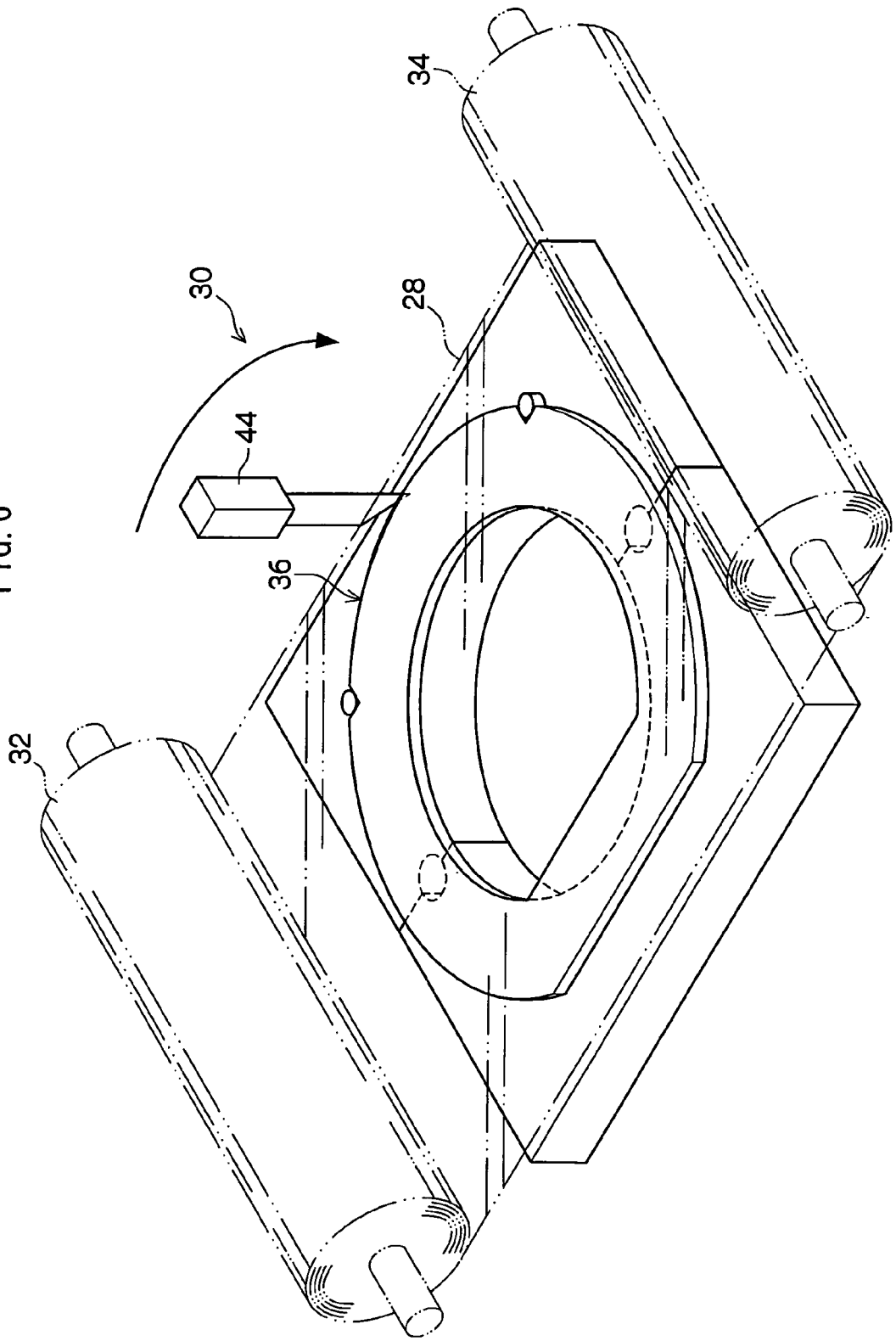
FIG. 6 is a perspective view showing the manufacturing method of manufacturing IR cut filters using the substrate table relating to the first exemplary embodiment.

As shown in FIG. 6, a cutter 44 is provided above the dicing tape 28. By an unillustrated driving member, the cutter 44 is lowered and moves, and cuts the dicing tape 28, which is applied to a substrate ring 36, along the outer periphery of the substrate ring 36.

As shown in FIG. 3, a ring stage 38, on which the ring-shaped substrate ring 36 is placed, is held by an unillustrated frame, beneath the tape roller 32 and the take-up tape roller 34. Two positioning recesses 36A are provided at the outer peripheral portion of the substrate ring 36. The substrate ring 36 is positioned at the ring stage 38 due to the positioning recesses 36A being made to coincide with two positioning convex portions 38A which project from the ring stage 38.

A large circular hole 38B is provided in the central portion of the ring stage 38. Circular holes 38C, in which holding rods 42 which will be described later are inserted, are provided at both sides of the circular hole 38B. Further, a dividing line 38D is provided in the substantially central portion of the ring stage 38, along the conveying direction of the dicing stage 28 (i.e., the direction heading from the tape roller 32 toward the take-up tape roller 34). The ring stage 38 can be divided in two along the dividing line 38D, in the direction orthogonal to the conveying direction of the dicing tape 28 (hereinafter called "tape conveying direction").

Figure 8:
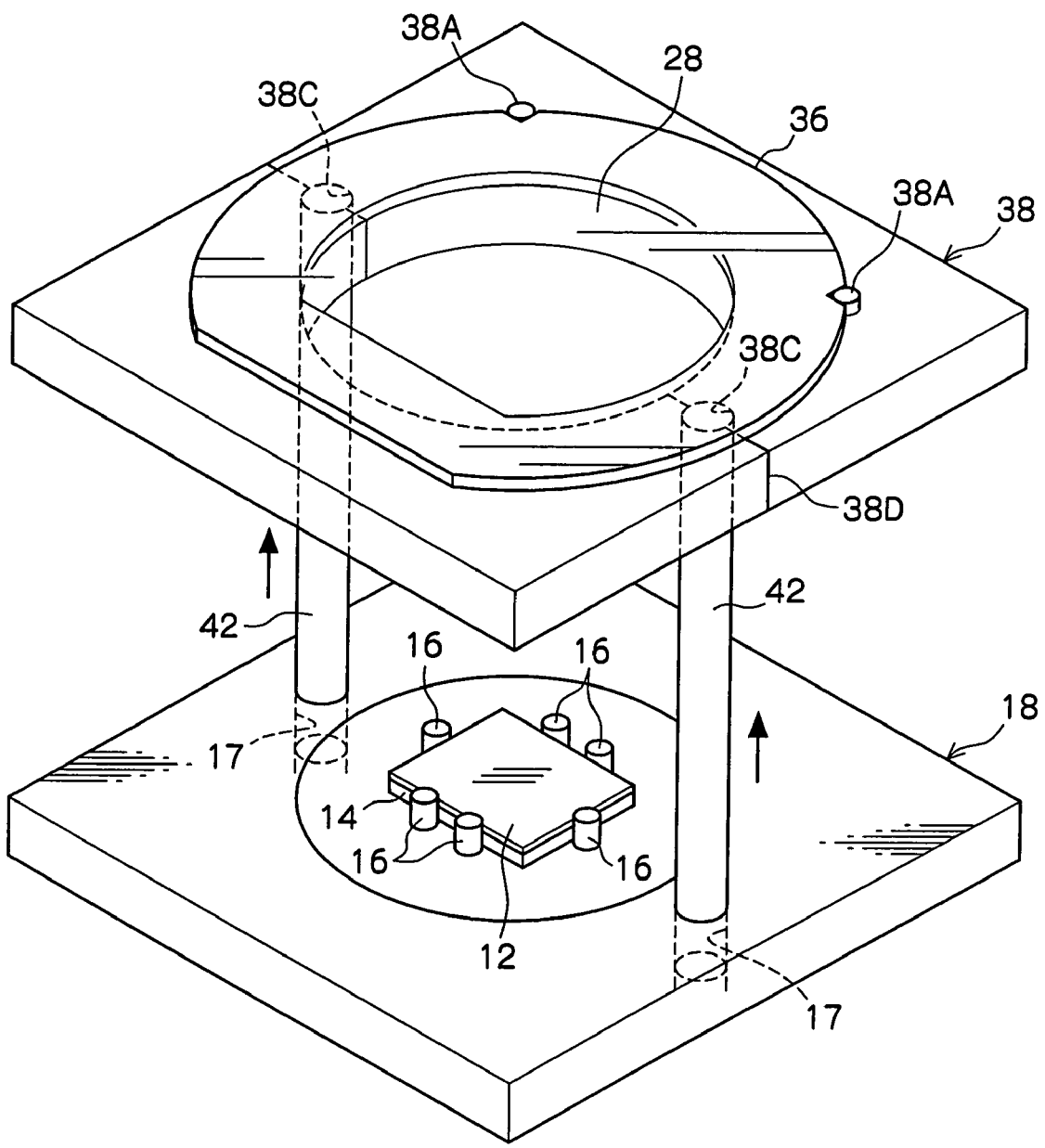
FIG. 8 is a perspective view showing the manufacturing method of manufacturing IR cut filters using the substrate table relating to the first exemplary embodiment.

On the other hand, as shown in FIG. 8, two through-holes 17 are provided in the stage unit 18. The holding rods 42 which are solid cylindrical are provided so as to pass through the through-holes 17.

When the stage unit 18 moves to beneath the ring stage 38, the holding rods 42 rise-up through the through-holes 17 and the circular holes 38C of the ring stage 38 so as to support the bottom surface of the substrate ring 36.

Figure 11:
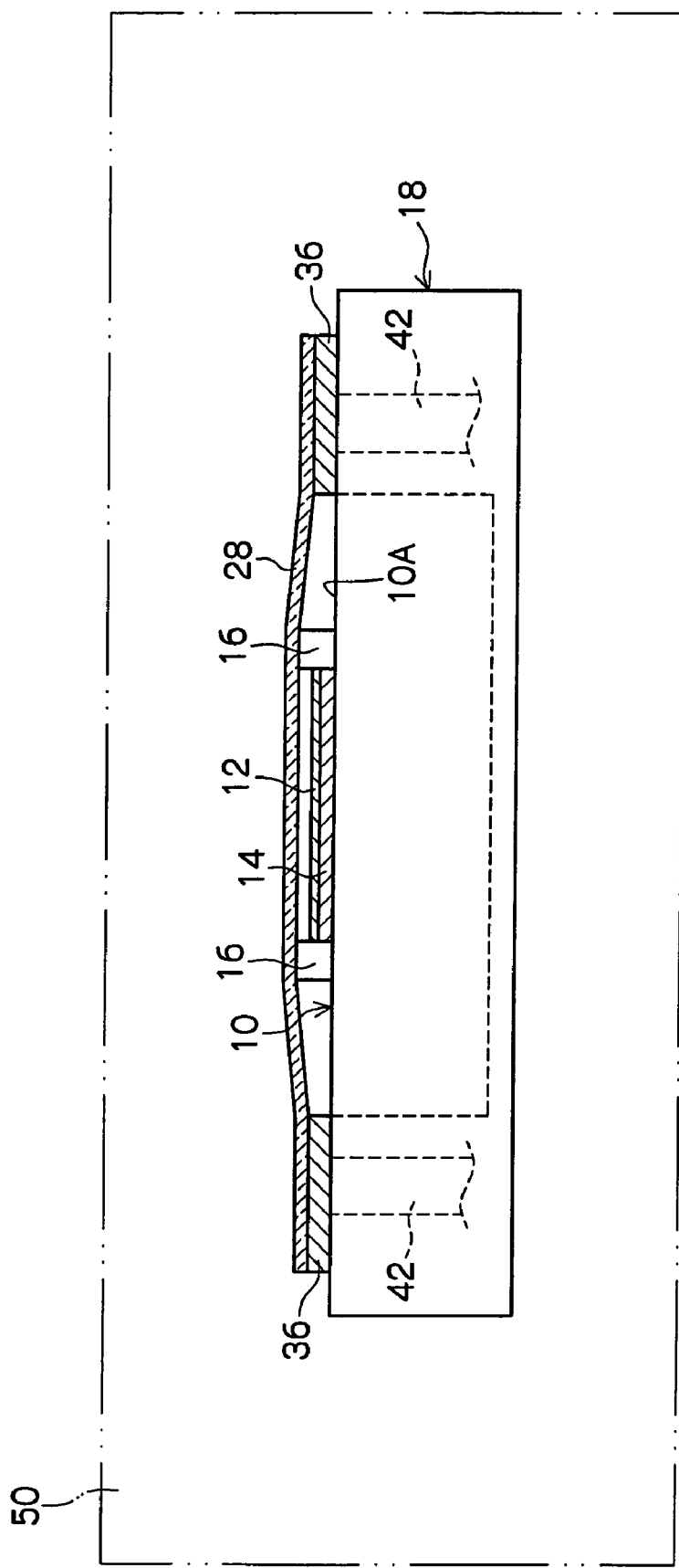
FIG. 11 is a side view showing the manufacturing method of manufacturing IR cut filters using the substrate table relating to the first exemplary embodiment.
Figure 12:
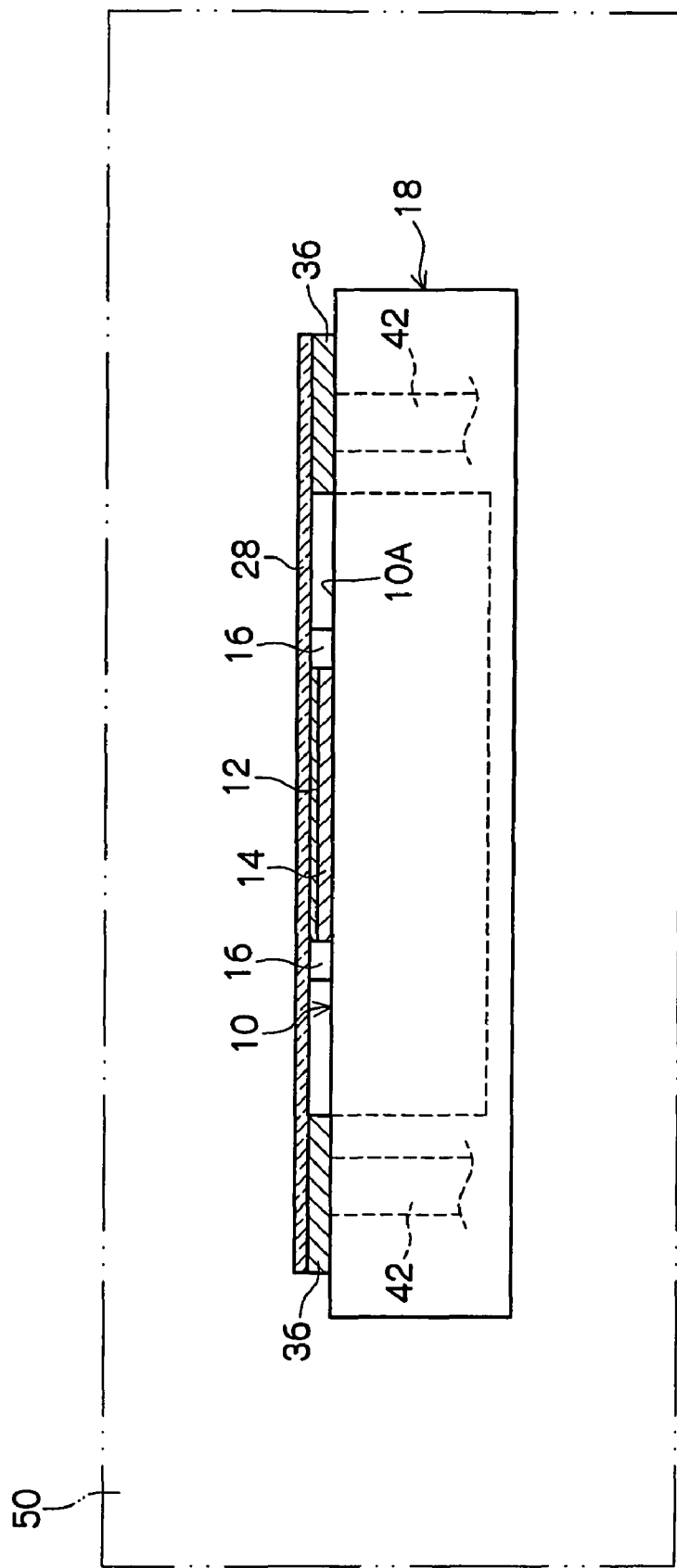
FIG. 12 is a side view showing the manufacturing method of manufacturing IR cut filters using the substrate table relating to the first exemplary embodiment.

Moreover, a vacuum chamber 50 such as shown in FIG. 11 and FIG. 12 is provided at the tape applying device 30. When the stage unit 18 is transferred to the vacuum chamber 50, a vacuum state is created in the region between the dicing tape 28 and the glass plate 12, and the dicing tape 28 is stuck firmly to the glass plate 12.

A manufacturing method of manufacturing the IR cut filters 22 by using the tape applying device 30 relating to the first exemplary embodiment will be described next.

Figure 4:
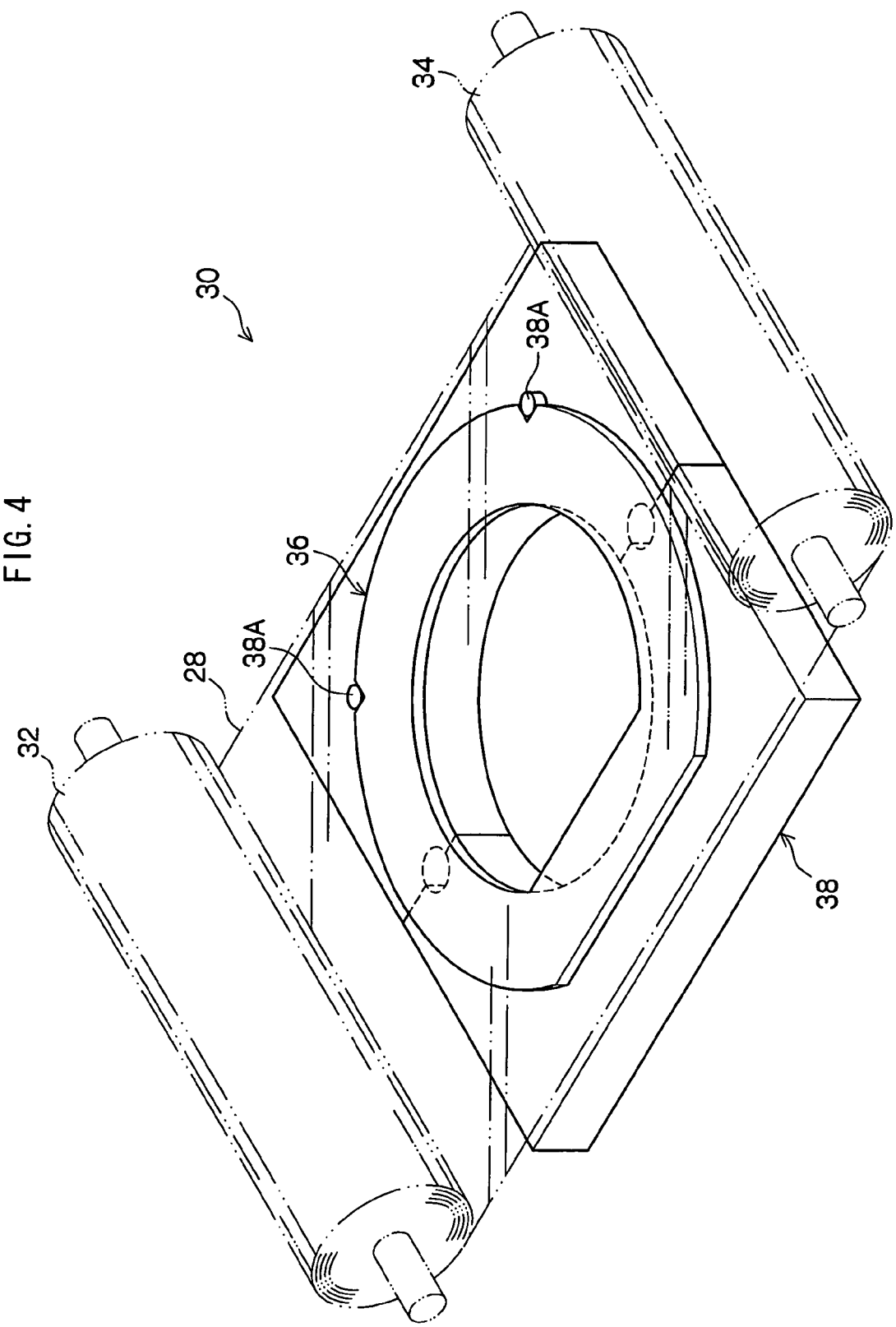
FIG. 4 is a perspective view showing the manufacturing method of manufacturing IR cut filters using the substrate table relating to the first exemplary embodiment.

As shown in FIG. 3 and FIG. 4, the positioning recesses 36A of the substrate ring 36 are made to correspond to the positioning convex portions 38A of the ring stage 38 such that the substrate ring 36 is positioned on the ring stage 38, and the ring stage 38 is moved to beneath the dicing tape 28.

As shown in FIG. 5, the pressure-bonding roller 40 moves in the tape conveying direction while pressing the dicing tape 28 against the substrate ring 36, and the dicing tape 28 is applied to the substrate ring 36.

Then, as shown in FIG. 6, due to the unillustrated driving member, the cutter 44 descends, and moves along the outer peripheral configuration of the substrate ring 36 and cuts the dicing tape 28.

Figure 7:
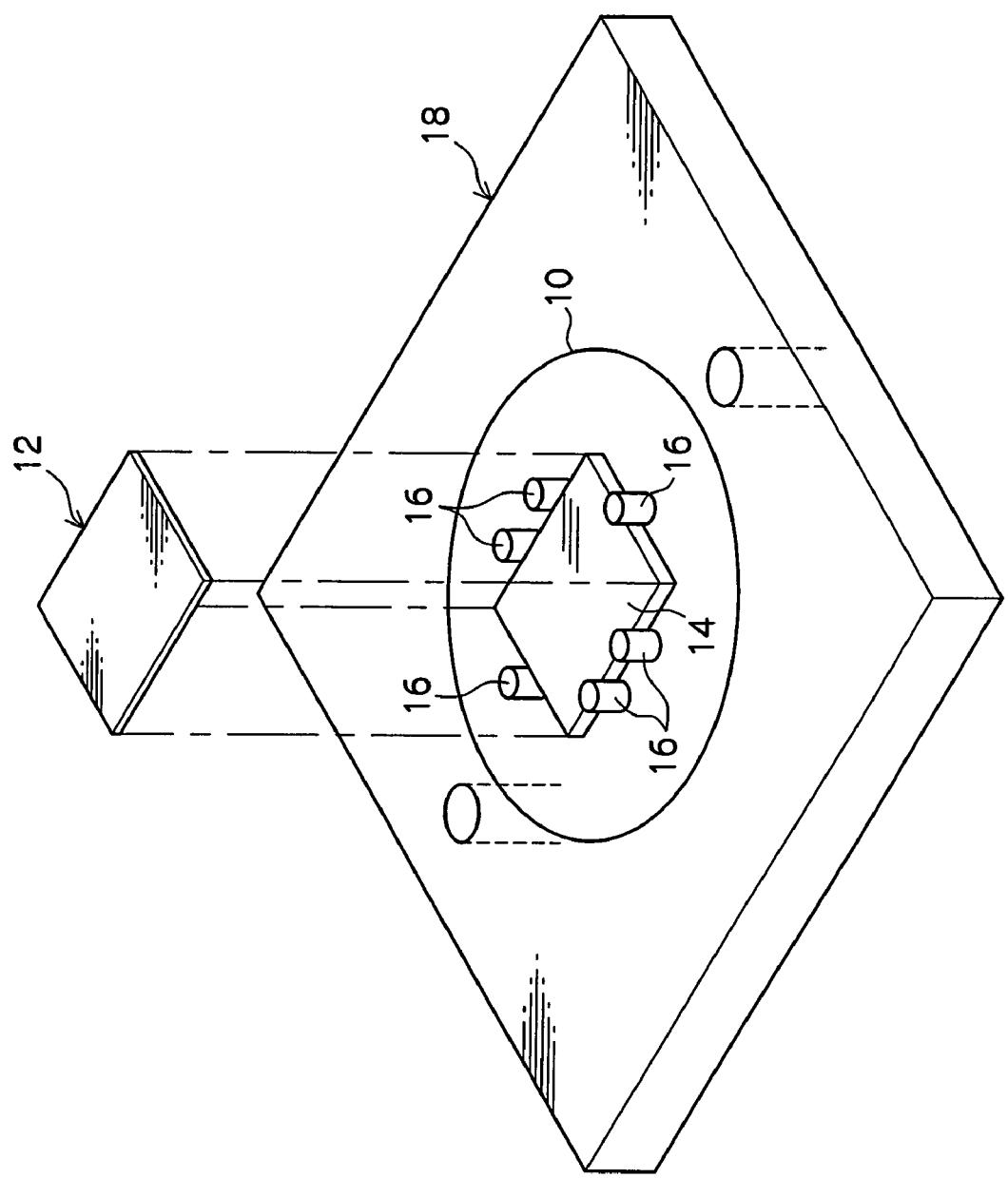
FIG. 7 is a perspective view showing the manufacturing method of manufacturing IR cut filters using the substrate table relating to the first exemplary embodiment.

Further, as shown in FIG. 7, the glass plate 12 is placed on the substrate placement surface 14 of the substrate table 10. At this time, the four sides of the rectangular glass plate 12 abut the outer peripheral surfaces of the guide pins 16, and the glass plate 12 is positioned on the substrate table 10.

Here, if the glass plate 12 is warped, the positioning function of the guiding pins 16 can be ensured by adjusting the projected positions of the guide pins 16 in advance as described above.

Further, as shown in FIG. 8, when the stage unit 18 is moved to beneath the ring stage 38, the ring stage 38 and the stage unit 18 are set in a predetermined positional relationship in the vertical direction (i.e., are positioned). At this time, the holding rods 42 rise-up through the through-holes 17 of the stage unit 18 and the circular holes 38C of the ring stage 38, and support the substrate ring 36.

Figure 9:
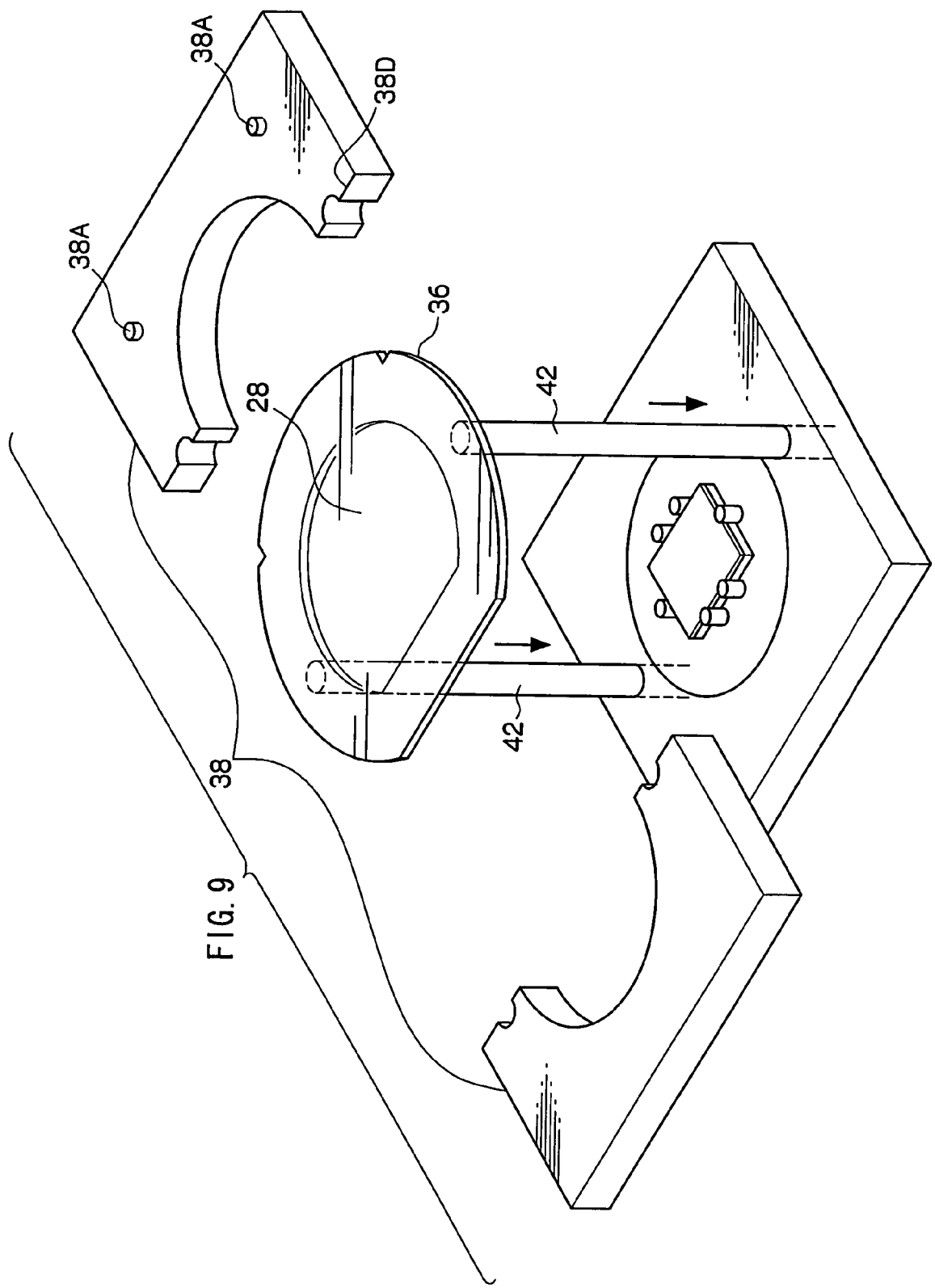
FIG. 9 is a perspective view showing the manufacturing method of manufacturing IR cut filters using the substrate table relating to the first exemplary embodiment.

Next, as shown in FIG. 9, in the state in which the substrate ring 36 is supported by the holding rods 42, the ring stage 38 is divided, in the direction orthogonal to the tape conveying direction, at the dividing line 38D.

Figure 10:
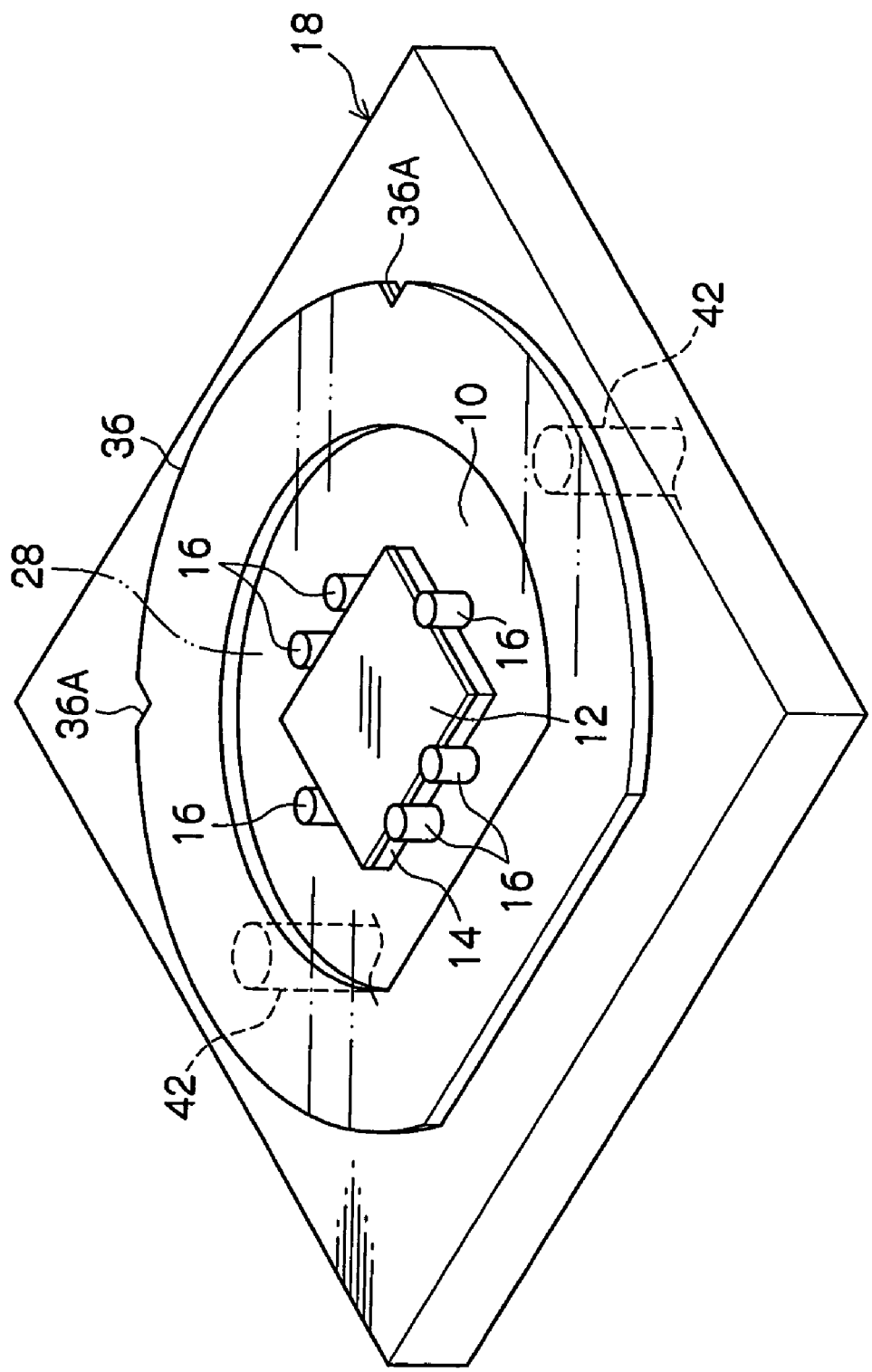
FIG. 10 is a perspective view showing the manufacturing method of manufacturing IR cut filters using the substrate table relating to the first exemplary embodiment.

Then, as shown in FIG. 10, due to the holding rods 42 being lowered, the substrate ring 36 is positioned with respect to the glass plate 12.

Next, as shown in FIG. 1, the stage unit 18 in this state is moved to the vacuum chamber 50 which is in a vacuum state. When the stage unit 18 is moved into the vacuum chamber 50, the region between the dicing tape 28 and the glass plate 12 becomes a vacuum state, and the dicing tape 28 and the glass plate 12 are stuck firmly together.

At the time of sticking the dicing tape 28 and the glass plate together, as shown in FIG. 12, the dicing tape 28 lowers the guide pins 16 against the urging forces of the coil springs 20, and the dicing tape 28 is thereby applied to one surface of the glass plate 12.

Because the guide pins 16 can be lowered (retracted) at the time of applying the dicing tape 28 to the one surface of the glass plate 12 in this way, the guide pins 16 do not impede the work of applying the dicing tape 28 to the glass plate 12.

Namely, even if the glass plate 12 is warped, the projected positions of the guide pins 16 can be made to be high in advance, and the guide pins 16 can position the glass plate 12, and the dicing tape 28 can be applied to the one surface of the glass plate 12.

Further, although the dicing tape 28 is stuck firmly to the glass plate 12 by a vacuum state in the present exemplary embodiment, instead, a pressure-bonding roller or the like may be used. In this case, since the substrate placement surface 14 on which the glass plate 12 is disposed projects-out from the surface of the substrate stage 10A, even if the dicing tape 28 is pushed against the substrate placement surface 14 from above the glass plate 12 by the pressure-bonding roller or the like such that the dicing tape 28 is made to stick firmly to the glass plate 12, the dicing tape 28 will not adhered to the surface of the substrate stage 10A.

Figure 13:
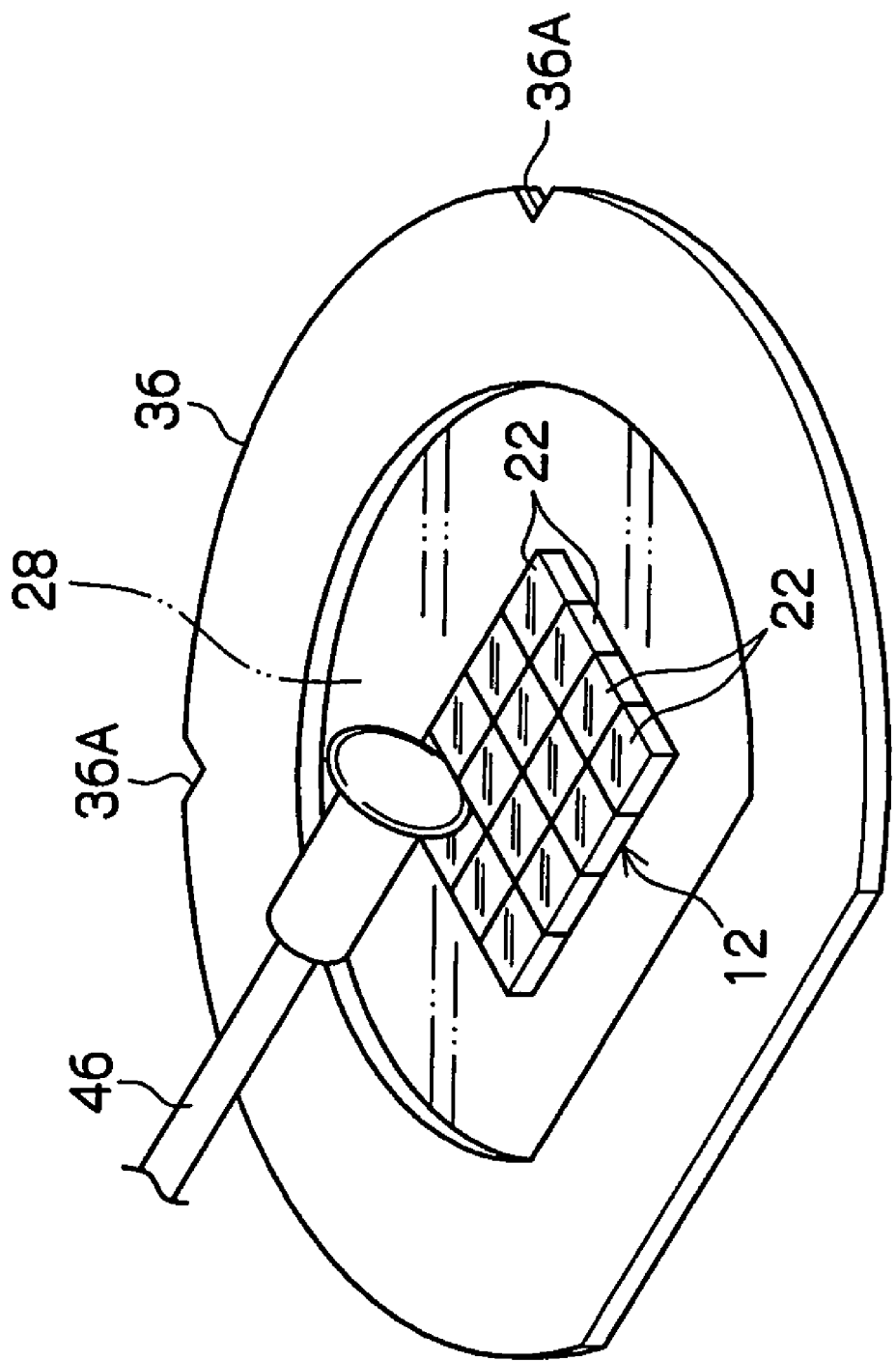
FIG. 13 is a perspective view showing the manufacturing method of manufacturing IR cut filters using the substrate table relating to the first exemplary embodiment.

Next, as shown in FIG. 13, the glass plate 12 is cut by the dicing device 46 with the substrate ring 36 as a reference, and the IR cut filters 22 for cell phones are manufactured.

In this way, the glass plate 12 is positioned on the substrate table 10, and further, the substrate ring 36 is disposed at a predetermined position of the substrate table 10, and the dicing tape 28 is applied to the glass plate 12. Therefore, in the state in which the glass plate 12 is applied to the dicing tape 28, the substrate ring 36 and the glass plate 12 are positioned surely.

Further, the glass plate 12, which is positioned with the substrate ring 36, is cut with the substrate ring 36 being used as a reference. Therefore, the glass plate 12 can be cut accurately, and the IR cut filters 22 can be manufactured from the glass plate 12 without waste.

Note that, although a specific exemplary embodiment is described in detail above, the present invention is not limited to this exemplary embodiment, and it will be apparent to those skilled in the art that various other exemplary embodiments are possible within the scope of the present invention. For example, in the above-described exemplary embodiment, the substrate table 10 is used in order to apply the dicing tape 28, but the substrate table 10 may be used in order to apply a protective tape which protects the one surface of the glass plate 12, or the like.

Further, in the above-described exemplary embodiment, the glass plate 12 is split and cut so as to manufacture the IR cut filters 22. However, the present invention may be used in the manufacturing of semiconductors, including the splitting and cutting of semiconductor substrates or the like.

Moreover, in the above-described exemplary embodiment, the dicing tape 28 is applied to the glass plate 12 by creating a vacuum state. However, the dicing tape 28 may be applied to the glass plate 12 by using a pressure-bonding roller or the like.

In the above-described exemplary embodiment, the glass plate 12 is positioned by using the solid cylindrical guide pins 16 as the guiding members. However, the glass plate 12 may be positioned by using guiding members which are plate-shaped or the like.

Still further, in the above-described exemplary embodiment, the urging forces of the coil springs 20 are utilized in order to project and retract the guide pins 16, but the guide pins 16 may be project and retract by using solenoids or the like in consideration of the timing.

A tape applying device 70, which relates to a second exemplary embodiment and uses the substrate table 10 relating to the present exemplary embodiment, will be described next in accordance with FIG. 14 through FIG. 17. Note that members which are the same as in the first exemplary embodiment are denoted by the same reference numerals and description thereof is omitted.

Figure 14:
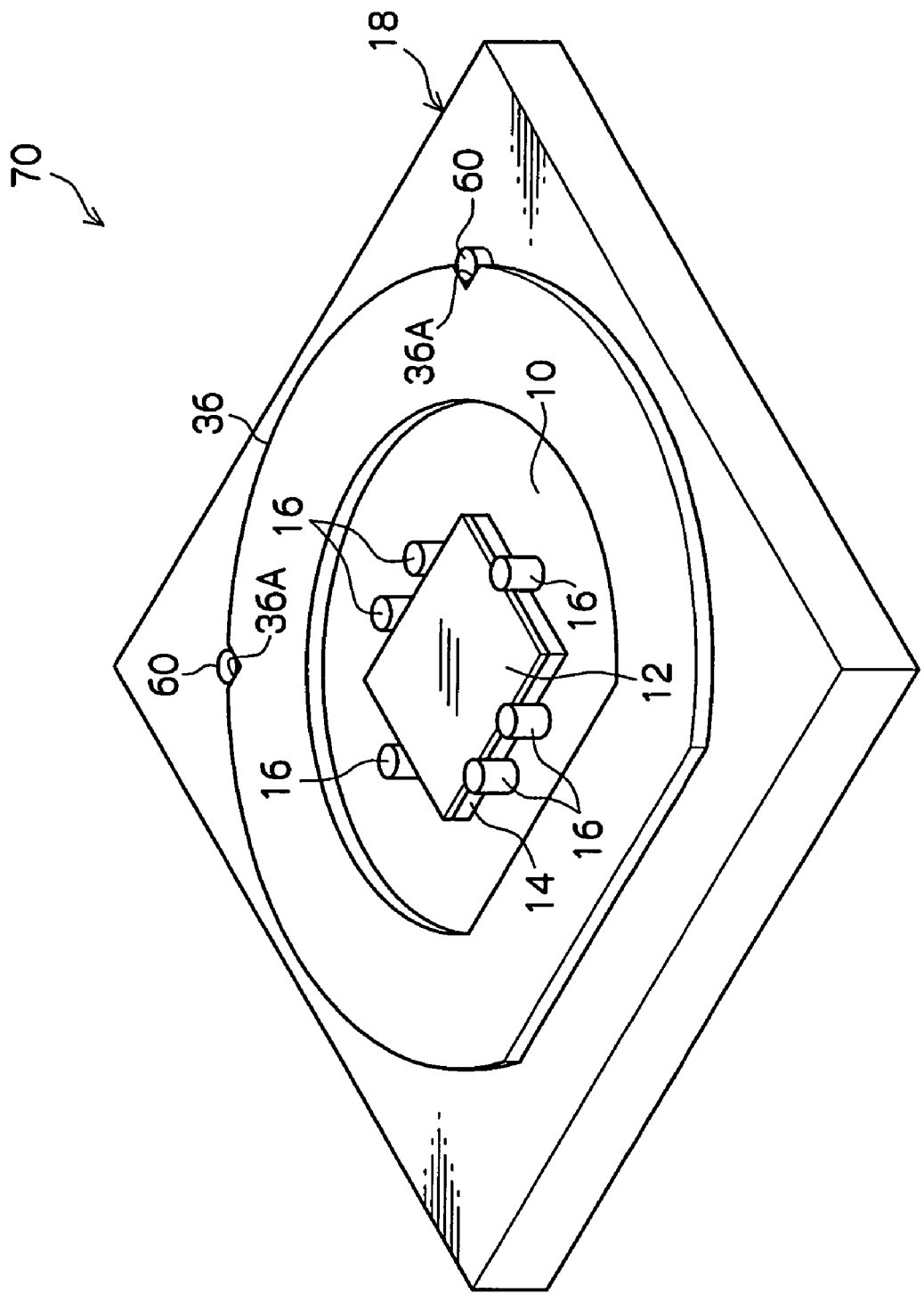
FIG. 14 is a perspective view showing a manufacturing method of manufacturing IR cut filters using a substrate table relating to a second exemplary embodiment.

In the second exemplary embodiment, as shown in FIG. 14, positioning convex portions 60 are provided at the stage unit 18, which is different than in the first exemplary embodiment. Due to the positioning convex portions 60 being made to coincide with the positioning recesses 36A provided at the substrate ring 36, the substrate ring 36 is positioned with respect to the substrate table 10.

A manufacturing method of manufacturing the IR cut filters 22 by using the tape applying device 70 relating to the second exemplary embodiment will be described next.

As shown in FIG. 14, the glass plate 12 is placed on the substrate placement surface 14 of the substrate table 10. Further, due to the positioning convex portions 60 of the stage unit 18 being made to coincide with the positioning recesses 36A provided at the substrate ring 36, the substrate ring 36 is placed at a predetermined position of the substrate table 10 so as to surround the glass plate 12, and the substrate ring 36 is positioned with respect to the glass plate 12.

Figure 15:
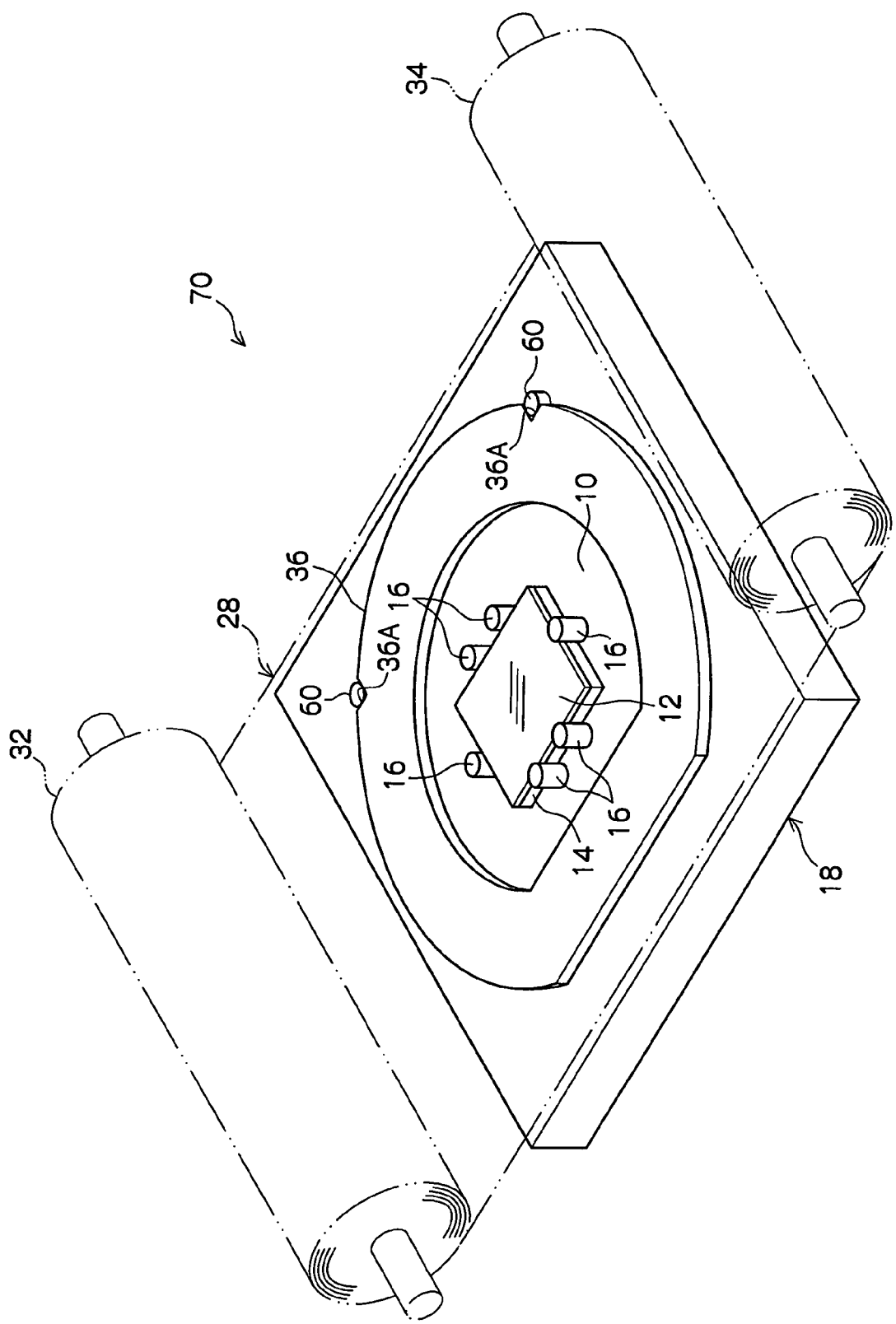
FIG. 15 is a perspective view showing the manufacturing method of manufacturing IR cut filters using the substrate table relating to the second exemplary embodiment.

Next, as shown in FIG. 15, the stage unit 18 is moved to beneath the dicing tape 28.

Figure 16:
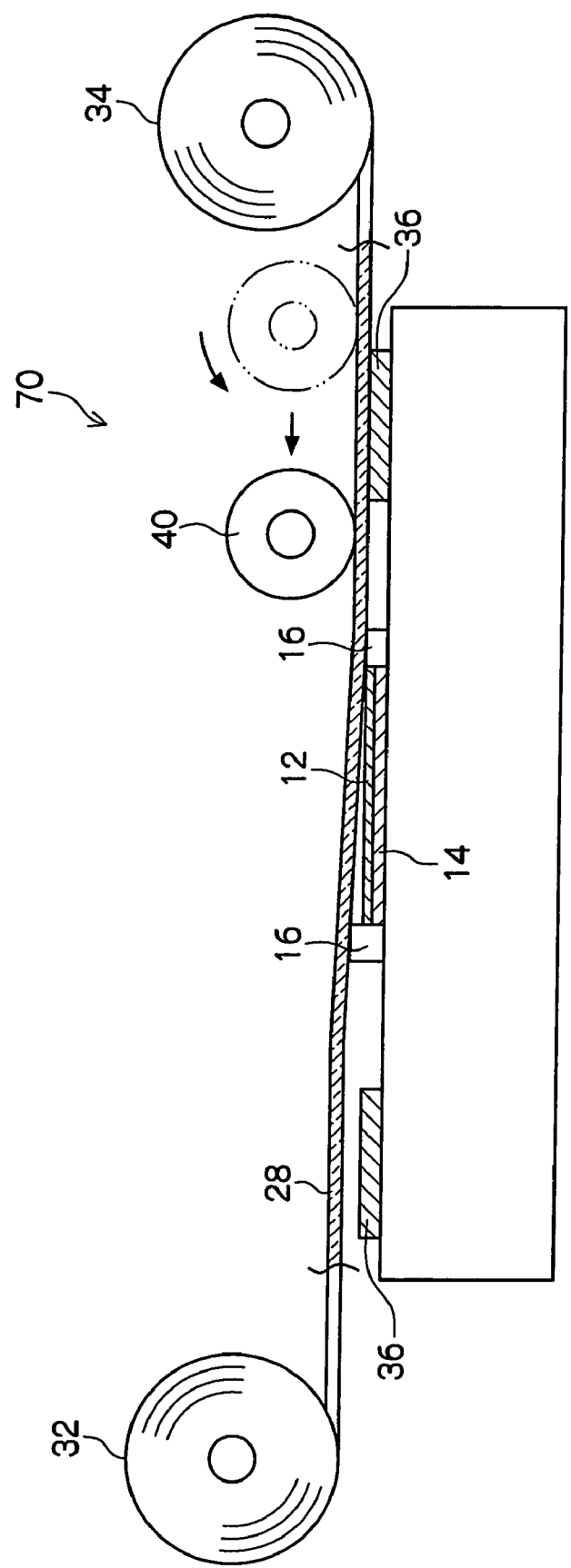
FIG. 16 is a side view showing the manufacturing method of manufacturing IR cut filters using the substrate table relating to the second exemplary embodiment.
Figure 17:
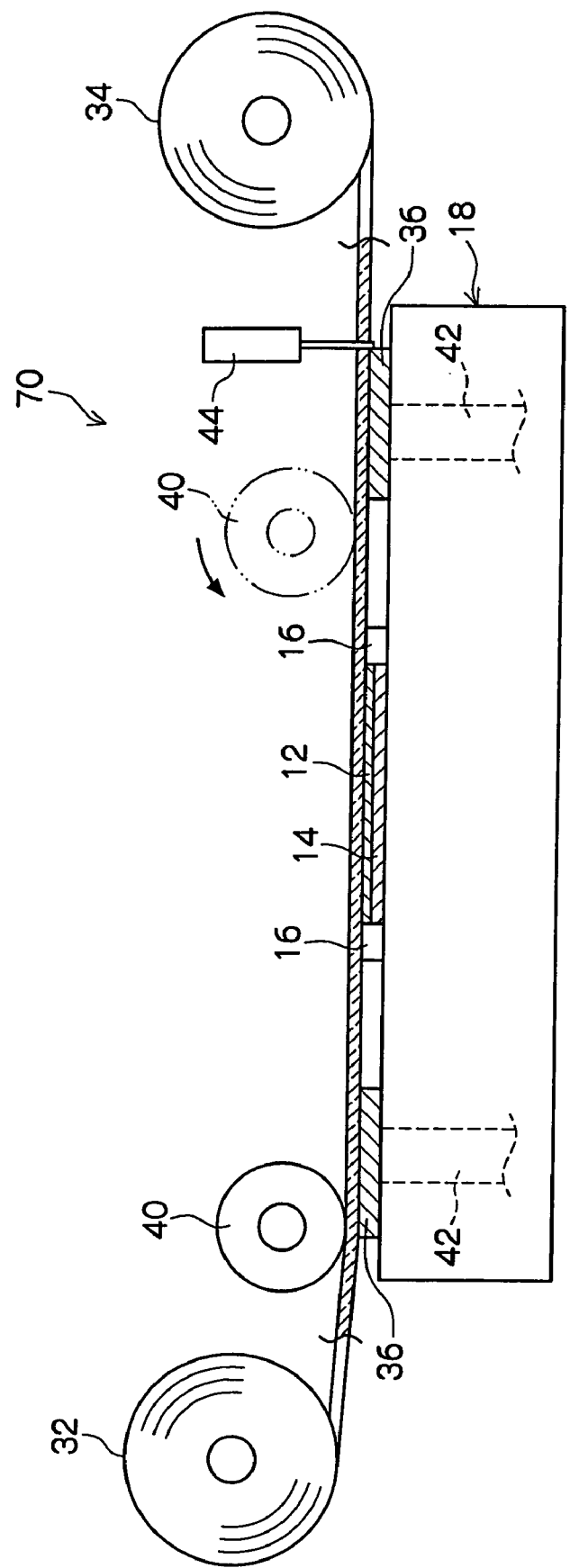
FIG. 17 is a side view showing the manufacturing method of manufacturing IR cut filters using the substrate table relating to the second exemplary embodiment.

Then, as shown in FIG. 16 and FIG. 17, the pressure-bonding roller 40 moves in the direction opposite the tape conveying direction while pushing the dicing tape 28 against the substrate ring 36, and applies the dicing tape 28 to the substrate ring 36 and the glass plate 12 while lowering the guide pins 16.

Next, by an unillustrated driving member, the cutter 44 descends, and moves along the outer peripheral configuration of the substrate ring 36, and cuts the dicing tape 28.

Then, the glass plate 12 is cut by the dicing device 46 (see FIG. 13) with the substrate ring 36 as a reference, and the IR cut filters 22 which can be used for cell phones are manufactured.

In this way, the glass plate 12 is positioned on the substrate table 10, and further, the substrate ring 36 is disposed at a predetermined position of the substrate table 10, and the dicing tape 28 is applied to the glass plate 12 and the substrate ring 36. Therefore, at the time of applying the glass plate 12 to the dicing tape 28, the substrate ring 36 and the glass plate 12 are positioned surely.

Further, the glass plate 12, which is positioned with the substrate ring 36, is cut with the substrate ring 36 being used as a reference. Therefore, the glass plate 12 is cut accurately, and the IR cut filters 22 can be manufactured from the glass plate 12 without waste.

Note that, although a specific exemplary embodiment of the present invention is described in detail above, the present invention is not limited to this exemplary embodiment, and it will be apparent to those skilled in the art that various other embodiments are possible within the scope of the present invention. For example, in the above-described exemplary embodiment, the dicing tape 28 is applied to the glass plate 12 and the substrate ring 36 by using a pressure-bonding roller 40. However, the dicing tape 28 may be applied to the glass plate 12 by creating a vacuum state in the region between, on the one hand, the dicing tape 28, and, on the other hand, the glass plate 12 and the substrate ring 36, by using a vacuum chamber or the like.

As described above, one exemplary embodiment of the present invention is a substrate table including: a substrate stage; a substrate placement surface formed on the substrate stage, and on which a substrate is placed; and a guiding member able to project and retract from the substrate placement surface, such that the guiding member positions the substrate due to the guiding member at a projected position abutting an edge portion of the substrate placed on the substrate placement surface and the guiding member retracts when applying a tape to the substrate.

In accordance with the above-described structure, the guiding member which is at the projected position abuts the edge portion of the substrate that is placed on the substrate placement surface, and determines the position of the substrate.

Here, if the substrate is warped, by making the projected position of the guiding member large in advance in accordance with the amount of warping, the guiding member can abut the edge portion of the substrate and can determine the position of the substrate, even if it is a warped substrate.

Further, because the guiding member retracts at the time of applying the tape to the substrate, the guiding member does not impede the work of applying the tape to the substrate.

In this way, even in cases in which a substrate is warped, the substrate is positioned on the substrate placement surface, and the tape can be applied to the substrate without shifting the substrate.

The above-described substrate table may further include: a substrate ring that is ring-shaped; and a ring guiding member that positions the substrate ring with respect to the substrate, wherein the substrate ring and the substrate are made integral by the tape being applied thereto.

In accordance with the above-described structure, the ring-shaped substrate ring is positioned with respect to the substrate by the ring guiding member. Thus, the tape is applied to the substrate ring and the substrate, and the substrate is made integral with the substrate ring.

Namely, in a case of cutting the substrate by using the substrate ring as a reference, because the substrate ring is positioned with the substrate, the substrate can be cut accurately and chips can be manufactured from the substrate without waste.

At the above-described substrate table, the substrate placement surface may project out from a surface of the substrate stage.

In accordance with the above-described structure, because the substrate placement surface projects-out from the surface of the substrate stage, the tape is not applied to the surface of the substrate stage.

The above-described substrate table may further include an urging member that urges the guiding member to the projected position.

In accordance with the above-described structure, the urging member urges the guiding member to the projected position and pushes the guiding member up. Further, the guiding member may retract against the urging force of the urging member when the guiding member is pressed from the above.

By this simple method, the guiding member is urged to the projected position, and further, the guiding member can be lowered (retracted).

The above-described substrate table may be structured such that the substrate is rectangular-shaped; and the guiding member comprises a plurality of guide pins, and each side of a first pair of opposing sides of the substrate is positioned by a first number of the plurality of guide pins, and each side of a second pair of opposing sides of the substrate is positioned by a second number of the plurality of guide pins that is less than the first number.

In accordance with the above-described structure, rotation of the substrate is restricted due to each side of the first pair of opposing sides of the substrate being positioned by a first number of guide pins. Parallel movement of the substrate is restricted by each side of the other second pair of opposing sides being positioned by a second number of guide pins. By using the first number and the second number of guide pins in this way, the substrate can be positioned surely at the substrate placement surface.

Further, a chip manufacturing method of the present exemplary embodiment may be chip manufacturing method for manufacturing chips by positioning a ring-shaped substrate ring and a substrate, applying a dicing tape, and cutting the substrate in a dicing process, the method including: applying the dicing tape to the substrate ring; placing the substrate on the substrate placement surface of the substrate table described above; positioning the substrate ring with respect to the substrate; applying the dicing tape, that is applied to the substrate ring, to the substrate while retracting the guiding member; and cutting out chips by cutting the substrate with a dicing device, with the substrate ring as a reference.

In accordance with the above-described method, the dicing tape is firstly applied to the ring-shaped substrate ring. Further, the substrate is placed on the substrate placement surface of the above-described substrate table. Next, the substrate ring is positioned with respect to the substrate. Then, while the guiding member is lowered (retracted), the dicing tape, that is applied to the substrate ring, is applied to the substrate. Further, the substrate is cut by a dicing device with the substrate ring as a reference, so as to cut-out chips.

By placing the substrate on the substrate placement surface of the above-described substrate table and applying the dicing tape in this way, the substrate ring and the substrate are surely positioned in a state in which the substrate is applied to the dicing tape.

Further, since the substrate, which is positioned with the substrate ring, is cut by using the substrate ring as a reference, the substrate can be cut accurately, and chips can be manufactured from the substrate without waste.

In the above-described chip manufacturing method, the applying of the dicing tape to the substrate may include applying the dicing tape to the substrate by creating a vacuum state in a region between the dicing tape and the substrate.

In accordance with the above-described structure, the dicing tape can be applied to the substrate by creating a vacuum state in the region between the dicing tape and the substrate, without using a pressure-bonding roller or the like.

In the above-described chip manufacturing method, the applying of the dicing tape to the substrate may include applying the dicing tape to the substrate by using a pressure-bonding roller that moves over the dicing tape while pressing the dicing tape onto the substrate.

In accordance with the above-described structure, the dicing tape can be applied to the substrate by causing a pressure-bonding roller to push and move from above the dicing tape, without using a vacuum chamber.

A chip manufacturing method of another exemplary embodiment may be chip manufacturing method for manufacturing chips by positioning a ring-shaped substrate ring and a substrate, applying a dicing tape, and cutting the substrate in a dicing process, the method including: placing the substrate on the substrate placement surface of the substrate table of described above; positioning the substrate ring with respect to the substrate; applying the dicing tape to the substrate and the substrate ring while retracting the guiding member; and cutting out chips by cutting the substrate with a dicing device, with the substrate ring as a reference.

In accordance with the above-described structure, the substrate is firstly placed on the substrate placement surface of the above-described substrate table. Further, the ring-shaped substrate ring is positioned with respect to the substrate. Then, while the guiding member is lowered (retracted), the dicing tape is applied to the substrate and the substrate ring. Next, the substrate is cut by a dicing device with the substrate ring as a reference, so as to cut-out chips.

By placing the substrate on the substrate placement surface of the above-described substrate table and applying the dicing tape to the substrate and the substrate ring in this way, the substrate ring and the substrate are surely positioned in a state in which the substrate is applied to the dicing tape.

Further, since the substrate, which is positioned with the substrate ring, is cut by using the substrate ring as a reference, the substrate can be cut accurately, and chips can be manufactured from the substrate without waste.

In the above-described chip manufacturing method, the applying may include applying the dicing tape to the substrate and the substrate ring by creating a vacuum state in a region between the dicing tape, and the substrate and the substrate ring.

In accordance with the above-described structure, the dicing tape can be applied to the substrate and the substrate ring by creating a vacuum state in the region between the dicing tape, and the substrate and the substrate ring, without using a pressure-bonding roller or the like.

In the above-described chip manufacturing method, the applying may include applying the dicing tape to the substrate by using a pressure-bonding roller that moves over the dicing tape while pressing the dicing tape onto the substrate.

In accordance with the above-described structure, the dicing tape can be applied to the substrate and the substrate ring by causing a pressure-bonding roller to push and move from above the dicing tape, without using a vacuum chamber.

As described above, in accordance with the exemplary embodiments, even if the substrate is warped, the substrate can be positioned, a tape can be applied to one surface of the substrate, the substrate can be cut accurately, and chips can be manufactured from the substrate without waste.

What is claimed is:

1. A substrate table comprising:
   a substrate stage;
   a substrate placement surface formed on the substrate stage, and on which a substrate is placed; and
   a guiding member able to project and retract from the substrate placement surface, such that the guiding member positions the substrate due to the guiding member at a projected position abutting an edge portion of the substrate placed on the substrate placement surface and a top end of the guiding member is lowered to a level of the substrate placement surface when applying a tape to the substrate.

2. The substrate table of claim 1, further comprising:
   a substrate ring that is ring-shaped; and
   a ring guiding member that positions the substrate ring with respect to the substrate,
   wherein the substrate ring and the substrate are made integral by the tape being applied thereto.

3. The substrate table of claim 1, wherein the substrate placement surface projects out from a surface of the substrate stage.

4. The substrate table of claim 1, further comprising an urging member that urges the guiding member to the projected position.

5. The substrate table of claim 1, wherein:
   the substrate is rectangular-shaped; and
   the guiding member comprises a plurality of guide pins, and each side of a first pair of opposing sides of the substrate is positioned by a first number of the plurality of guide pins, and each side of a second pair of opposing sides of the substrate is positioned by a second number of the plurality of guide pins that is less than the first number.

* * * * *